United States Patent [19]
Upadhyayula et al.

[11] 3,959,807
[45] May 25, 1976

[54] PLANAR TRANSFERRED ELECTRON DEVICE WITH INTEGRAL NONLINEAR LOAD RESISTOR

[75] Inventors: Chainulu Lakshminarasimha Upadhyayula, East Windsor; Subrahmanyam Yegna Narayan, Belle Mead, both of N.J.

[73] Assignee: RCA Corporation, New York, N.Y.

[22] Filed: Apr. 28, 1975

[21] Appl. No.: 572,020

[52] U.S. Cl. ................................. 357/3; 331/107 G
[51] Int. Cl.² ................... H01L 27/26; H03F 1/36
[58] Field of Search .................. 357/3; 331/107 G

[56] References Cited
UNITED STATES PATENTS 3,538,400  11/1970  Yanai et al. ............................. 357/3
3,588,736  6/1971  McGroddy ............................. 357/3

Primary Examiner—Stanley D. Miller, Jr.
Assistant Examiner—E. Wojciechowicz
Attorney, Agent, or Firm—Edward J. Norton; Robert L. Troike

[57] ABSTRACT

A large voltage swing across a typical planar transferred electron logic device is achieved by a nonlinear load resistor in series with the transferred electron device. The nonlinear load resistor includes a body of transferred electron effect material with an adjacent layer of high dielectric material. The layer is of sufficiently high dielectric material so that the load resistor so formed saturates at a current standoff point provided by the bias source of the logic device.

5 Claims, 9 Drawing Figures

PLANAR TRANSFERRED ELECTRON DEVICE WITH INTEGRAL NONLINEAR LOAD RESISTOR

This invention herein described was made in the course of or under the contract or subcontract with the Department of the Air Force.

BACKGROUND OF THE INVENTION

This invention relates to planar transferred electron devices (TED) and more particularly to signal processing devices utilizing such transferred electron devices. These TED devices are also referred to as Gunn logic devices. Planar transferred electron logic devices (TED) offer switching speeds on the order of 20 to 50 picoseconds with delay-dissipation products of 1 to 2 picojoules. Such speeds are not possible with CMOS (Complementary MOS) or ECL (Emitter Coupled Logic) devices. Such planar transferred electron devices are particularly useful for performing, gigabit rate signal processing, Fast Fourier Transforms, etc. These devices, however, generally do not provide large current drops which is essential to obtain large voltage outputs required for fan-out. A load resistor is usually placed in series with the devices for achieving the voltage drop with the associated current drop. A large series resistor will increase the voltage swing across the device but large load resistors may mean large RC time constants and as a result reduce the speed of operation. An attempt has been made to provide an active load instead of a resistive load. For example, an FET has been proposed as a load resistor to achieve an active load. This is described by K. Mause, et al in the proceedings of the Fourth Biennial Cornell Electrical Eng. Conf., 1973, Cornell University, Ithaca, N.Y., entitled "Monolithic Integration of Gallium Arsenide-Gunn Devices for Digital Circuits." The material requirements and the processing steps are somewhat different for FETs and TEDs. FET's have a thickness requirement where the nd product (thickness times doping density) be less than $5 \times 10^{11}$ cm$^{-2}$. The TED device, however, has a doping density times thickness requirement that it be greater than $1 \times 10^{12}$ cm$^{-2}$.

BRIEF DESCRIPTION OF INVENTION

Briefly, a planar transferred electron logic device is provided including a relatively broad planar body having a first conductive terminal near one end and a second conductive terminal near the opposite end. An electric field bias is applied across these terminals. A gating terminal is spaced near the first terminal. The doping density of the material, the length between the gating and second terminal, and the thickness of the body is selected such that the body is characterized by a transfer of electrons from high mobility sub-bands and the formation of domains upon the application of an electric field above a threshold value. The bias source applies an electric field at a first standoff value which is slightly below that of the threshold value. The gate in response to a signal above a given value applied thereto causes the field to exceed threshold in the region under the gate and cause the formation of domains. The subject invention relates to an improvement therewith of a nonlinear loading member in series with the planar body. The nonlinear loading member includes a second body of transferred electron material like that of the first body and a dielectric medium adjacent to the second body where the dielectric medium is of sufficient dielectric constant and thickness to cause the second body to present a current saturation at electric fields above the first value.

DETAILED DESCRIPTION

A more detailed description follows in conjunction with the following drawings wherein.

Figure 1:
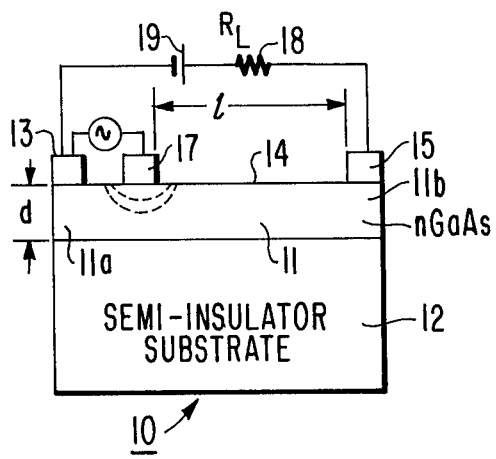
FIG. 1 is a functional sketch of a planar transferred electron device with biasing circuitry according to the prior art.

Referring to FIG. 1, a planar transferred electron logic device according to the prior art comprises a broad planar body of gallium arsenide material 11 on a block of semi-insulator material 12. The semi-insulator 12 may be gallium arsenide material having a resistivity on the order of $10^6$ to $10^8$ ohm-cm. The material of the body 11 has, for example, a doping density $1 \times 10^{16}$ cm$^{-3}$. The body 11 has a proper thickness and length so that with its doping density the device will operate as a planar transferred electron device. The length ($l$) of the device between the anode and gate terminals 15 and 17, respectively, together with the doping density ($n$) is selected so that the $nl$ product exceeds $1 \times 10^{13}$ cm$^{-2}$. Further, the thickness $d$, of the device 11 for gallium arsenide must be selected so that the nd product exceeds $1 \times 10^{12}$ cm$^{-2}$.

Figure 2:
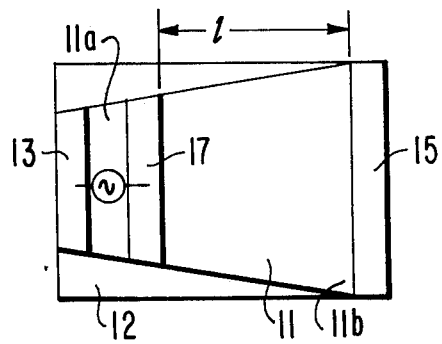
FIG. 2 is a top plan view of the arrangement shown in FIG. 1.

A cathode terminal 13 of conductive material is located on the top surface 14 and near one end 11a of planar body 11. An anode terminal 15 of conductive material is located on the top surface 14 and near the opposite end 11b of planar body 11. The body 11 is narrower near the cathode end 13 and broadens out linearly to the anode end 15. The anode end is for example about 1.5 times as wide as the cathode end. See FIG. 2. In the operation of the device, the electric fields are greater at the anode end. These fields can be so great that the metal at the anode terminal could migrate into the channel. By expanding the width near the anode end 11b, the high electric fields are reduced and metal migration is minimized. A conductive gate terminal 17 is placed on top of the surface 14 of the body 11. This gate terminal 17 is spaced about $1 \times 10^{-4}$ cm. from the cathode terminal 13 in the direction of the anode. In the arrangement illustrated in FIG. 1, length $l$ is the length between terminals 15 and 17. This length $l$ for a material with a doping density at $1 \times 10^{16}$ cm$^{-3}$ must be greater than about $1 \times 10^{-3}$ cm in order to maintain the $nl$ critical parameter of greater than $1 \times 10^{13}$ cm$^{-2}$. For a particular device using this material a length $l$ of $2.9 \times 10^{-3}$ cm has been selected. For this device the spacing between the cathode terminal 13 and anode terminal 15 is about $3.5 \times 10^{-3}$ cm and the gate width is about $5 \times 10^{-4}$ cm. The thickness of the material ($d$) must be greater than about $1 \times 10^{-4}$ cm in order to maintain the critical nd parameter of greater than $1 \times 10^{12}$ cm$^{-2}$. For the particular device selected the material thickness was about $2 \times 10^{-4}$ cm. In order to achieve the transfer of electrons from the high mobility to the low mobility sub-band and to cause domains to form, this material must be biased above that of the threshold voltage. The threshold voltage for such a material is on the order of 3.2 to 3.5 kilovolts per cm. A lesser voltage of, for example, 2.2 kilovolts per cm is all that is required to sustain domains.

The biasing field is provided by battery 19 which has the negative terminal end connected to cathode 13 and the positive terminal end connected to anode 15. The biasing voltage selected, for example, is about 0.9 times that of threshold. The battery voltage selected for the arrangement described in connection with FIG. 1 is 38 volts. At this voltage level domains are not formed but are sustained when formed. Signals for the logic device are coupled between the cathode terminal 13 and the gate terminal 17. These signals could be for example CW signals at microwave frequencies or pulses depending on the use. These signals applied to the gate terminal 17 cause a depletion region and cause an increase in the electric field in the region below the gate 17. The level of the signals applied to the gate are of a sufficient magnitude to create an electric field under the gate electrode that exceeds the threshold field whereby domains are generated. These domains are sustained and propagate from the gate 17 to the anode 15 due to the presence of the 0.9 times threshold field supplied by the battery 19. As can be seen viewing FIG. 3, the current at a 0.9 times threshold bias is at a first level $I_s$. This current level $I_s$ is commonly referred to as the standoff current level. When the signal applied to the gate 17 is such as to increase the biasing field above threshold, the current decreases to a level $I_D$ in FIG. 3. This change of current ΔI is the output current change due to a change in state of this logic device. A load resistor 18 can be placed in series with the battery 19 and the device to translate this current change into a voltage change. When the device is triggered by applying the external signal, the device current drops and the voltage across the load resistor 18 decreases, i.e. voltage across the device terminals 13 and 15 increases. The larger the voltage that is available across the device the larger the voltage swing and the more useable the device becomes.

Figure 4:
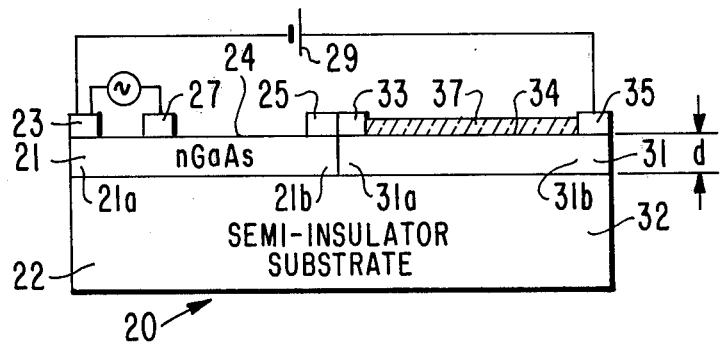
FIG. 4 is a functional sketch of a planar transferred electron logic device according to one embodiment of the present invention.
Figure 5:
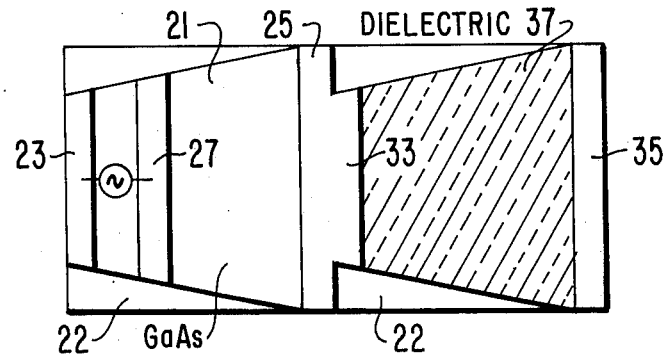
FIG. 5 is a top plan view of the embodiment shown in FIG. 4.

Referring to FIGS. 4 and 5, there is illustrated a planar transferred electron device with an integrated load resistor. According to the present invention, a body 21 of n- type gallium arsenide material is grown on a semi-insulator substrate 22. The substrate 22 is like that described previously in connection with substrate 12 in FIG. 1. A conductive cathode terminal 23 is located on the top surface of and near one end 21a of the body 21, and a conductive anode terminal 25 is located at the opposite end 21b of the body 21. Also placed on the same semi-insulator substrate 22 is a second broad planar body 31 of n-type gallium arsenide material like that of body 21 and body 11 in FIG. 1. The body 31 could be a continuation of the first body 21 so that bodies 21 and 31 are formed together when making the device. A portion 33 of terminal 25 may also extend on top of the body 31. A further terminal 35 is located on the top surface 34 of body 31 near the opposite end of body 31 with respect to terminal 25. The body 21 and the body 31 may both be tapered as illustrated in FIG. 5. This taper is like that of body 11 in FIG. 1. The body 21 is relatively narrow near the cathode 23 end and broadens linearly to the terminal end 25. Similarly, the taper of the body 31 increases linearly with the relatively narrow end 31a near portion 33 of terminal 25 broadening to the other end 31b near terminal 35. For example, the spacing between the gate terminal 27 and anode terminal 25 is about $2.9 \times 10^{-3}$ cm. The spacing between the cathode terminal 23 and anode terminal 25 and between terminal 25 and terminal 35 are each $3.5 \times 10^{-3}$ cm. The spacing between the gate terminal 27 and cathode terminal 25 is about $1 \times 10^{-4}$ cm.

Figure 6:
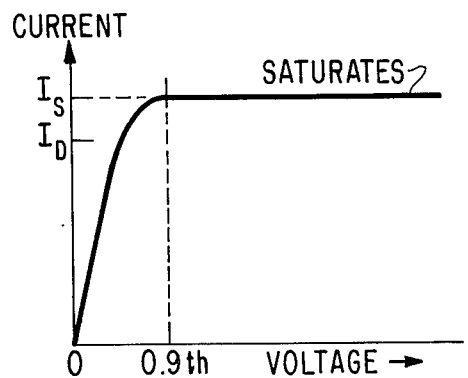
FIG. 6 is an I-V plot of a nonlinear load resistor as provided by the present invention.

A layer of relatively high dielectric material 37 is placed on top of surface 34 of the body 31. The dielectric constant of the material of layer 37 is made on the order of at least 1.25 times the dielectric constant of the body 31 of the gallium arsenide material. For example, this dielectric material may have a relative dielectric constant of 15 to 24 where the relative dielectric constant of the body 31 is 12. High dielectric materials such as rutile may be used. The thickness of the dielectric layer 37 must be at least equal to the width of a domain. The dielectric material of layer 37 is selected such that the body 31 together with the dielectric layer 37 acts to form a nonlinear load resistor which saturates at about the biasing level of the standoff current $I_s$ as shown in FIG. 6. The thickness $d$ of the material of body 31 is on the order of $2 \times 10^{-4}$ cm and the thickness of the dielectric layer 37 is on the order of 3,000 angstroms. The biasing voltage provided by battery 29 is coupled between terminal 23 and terminal 35. The battery voltage for the example described above in connection with FIGS. 4 and 5 is 20 to 25 volts. The device operates in the manner of the previously described planar transfer electron logic device in the region between cathode terminal 23 and anode terminal 25. The input or control signal is coupled between the cathode terminal 23 and a gate terminal 27 located adjacent thereto on the top surface 24 of body 21. When an input signal is applied to the gate 27 and domains are formed, the current drops to the level $I_D$ illustrated in FIG. 3. This current drop causes a decrease in current across the nonlinear load presented by the body 31 loaded by high dielectric layer 37. This decrease in current across the large resistance presented by loaded body 31 which is operating below saturation causes a large voltage change across the total structure. Hence, a large voltage swing is available across the device without increasing the RC time constant of the device. Further, this nonlinear active load resistor does not require as high a biasing voltage as would be required with a large load resistor and does not waste as much power. Further, this arrangement due to the saturation level, is not as susceptible to noise as the load resistor arrangement.

Figure 3:
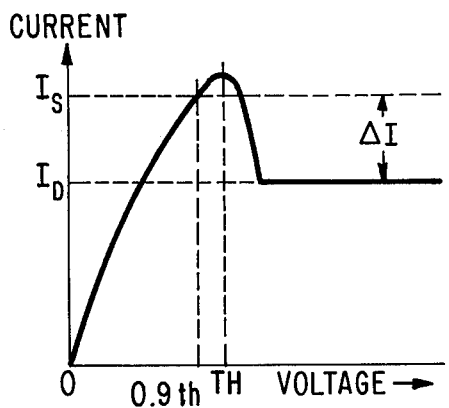
FIG. 3 is an I-V plot of the transferred electron device in FIG. 1.
Figure 7:
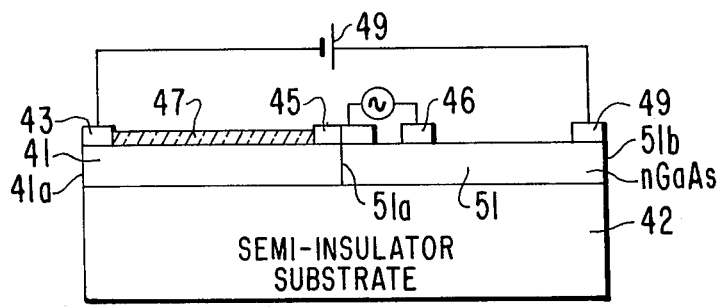
FIG. 7 is a functional sketch of a planar transferred electron logic device according to another embodiment of the present invention.
Figure 8:
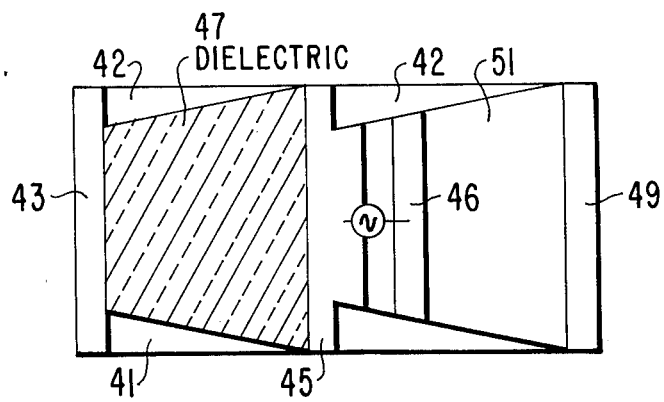
FIG. 8 is a top plan view of the embodiment shown in FIG. 7.

Referring to FIGS. 7 and 8, there is illustrated another approach to achieving the nonlinear load resistor. In this arrangement, the nonlinear load resistor is positioned at the cathode rather than at the anode of the transferred electron logic device. The transferred electron device 40 includes a body 51 of gallium arsenide material as described previously in connection with FIG. 1 mounted on a semi-insulator substrate 42. Body 41 of gallium arsenide transferred electron material is mounted on the semi-insulator substrate 42 and joins body 51 at end 51A. A common terminal 45 bridges on the top surface of bodies 41 and 51 at end 51A. A terminal 49 is located at the opposite end 51b of body 51. A terminal 43 is located at the end 41a of body 41 where end 41a is remote from terminal 45. A layer of dielectric material 47 like that of dielectric material 37 in FIG. 4 is located on the top surface of body 41. The layer of dielectric material 47 on the body 41 acts with the body 41 to provide the nonlinear loading resistor which saturates at the standoff current level of the device. The standoff biasing current is provided by the battery 49 coupled across terminals 43 and 49. The battery voltage for the example described in connection with FIGS. 7 and 8 is 20 to 25 volts. Control signals are applied between terminal 45 and a gate terminal 46 located 1 to $2 \times 10^{-4}$ cm for example from terminal 45. When the control signal exceeds a given level at terminal 46, the device excites domains which propagate to terminal 49 and causes a decreased current as illustrated in FIG. 3. This drop in current causes a decrease in voltage developed across the loading device of the body 41 and the dielectric material 47 and an increase in the voltage across terminals 43 and 49.

Figure 9:
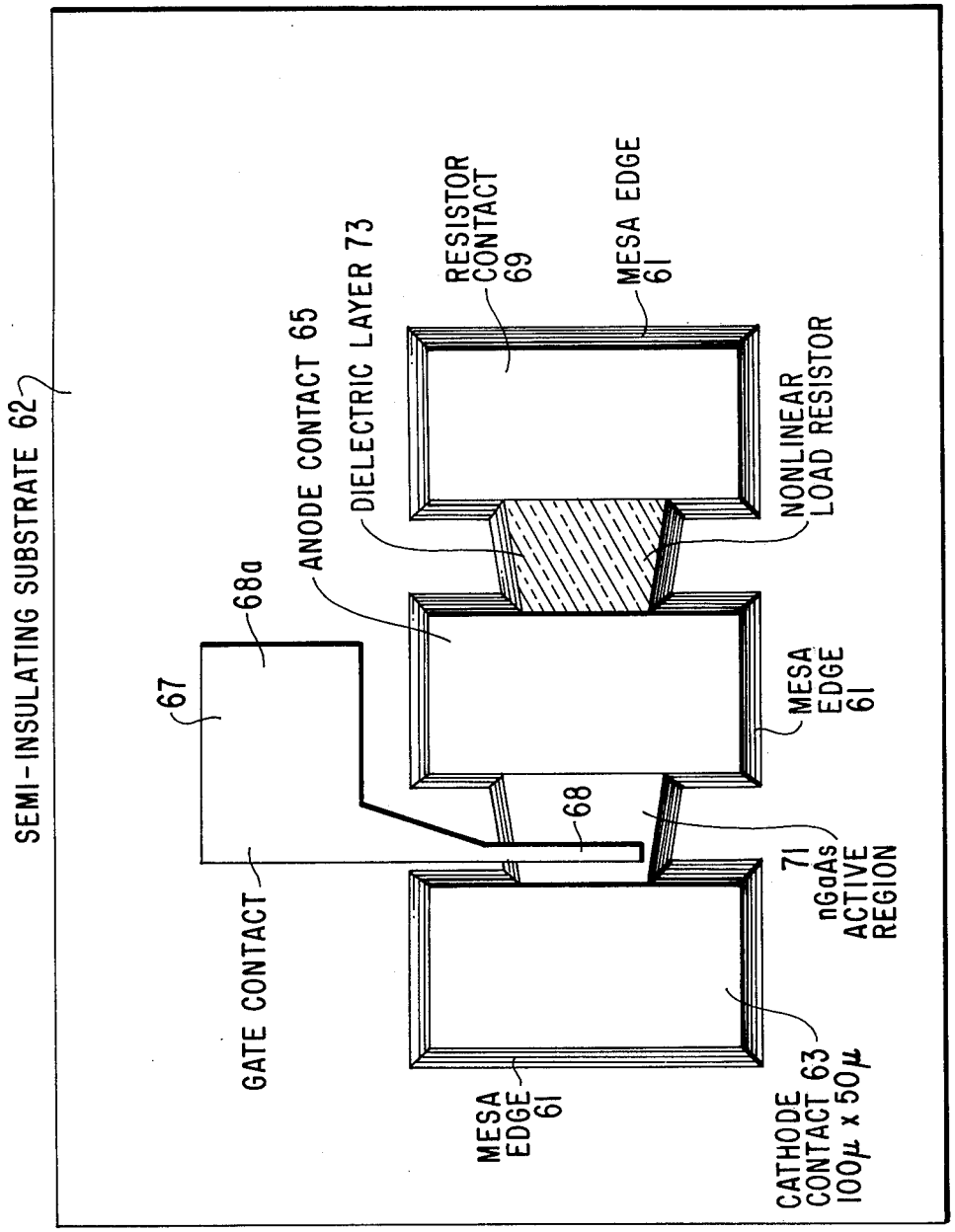
FIG. 9 is a top plan view of a typical planar transferred electron device according to the present invention.

Referring to FIG. 9 there is illustrated the top plan view of a typical device as described in connection with FIGS. 4 thru 6. In actual practice the cathode, anode, gate and resistor contacts must be made much larger in proportion to the active and load resistor regions in order to accommodate present state of the art bonding techniques. On top of the semi-insulating substrate 62 is formed an n-type gallium arsenide layer 61 having the shape as outlined by the mesa edge. The cathode contact 63 is formed by a layer of conductive material about 100 microns by 50 microns on top of the layer 61. The anode contact 65 and load resistor contact 69 are formed by a similar sized conductive layer on the gallium arsenide layer 61. The active region 71 is located between contacts 63 and 65 and is formed by layer 61. The gate electrode 67 includes a narrow conductive strip 68 on the active region 71. This narrow conductive strip 68 extends across the active region 71 near the cathode contact 63 and down along the mesa edge of layer 61 to a broad conductive pad 68a on the substrate 62. The thickness of the layer 61 and the length of the active region 71 between the portion 68 of gate 67 and the anode contact 65 is made as discussed previously in connection with FIGS. 1, 2, 4 and 5. Also the n-type gallium arsenide material in layer 61 is like that discussed previously in connection with FIGS. 1, 2, 4 and 5. A layer 73 of dielectric material like that described in connection with element 37 of FIGS. 4 and 5 is fixed on top of layer 61 of n-type gallium arsenide material. It is understood that while a gallium arsenide device has been described in the preferred embodiments, other materials such as $I_n$ P (Indium Phosphide) and $I_n$ $G_a$ $S_b$ (Indium Gallium Antimonide) exhibiting similar transferred electron effects can also be used.

What is claimed is:

1. In a planar transferred electron logic device of the type comprising a first relatively broad planar body of material having a first conductive terminal near one end and a second conductive terminal near the opposite end and a gating terminal spaced near said first terminal, said material having a doping density and a length and thickness selected such that said body is characterized by a transfer of electrons from a high to a low mobility sub-band and the formation of domains upon the application of an electric field above threshold, means connectable to a bias source for applying an electric field across said first and second terminal with a first value slightly below that of threshold, said gating terminal being responsive to a signal above a given level causing said transferred electron effect and domains to form, the improvement therewith comprising:

a non-linear loading member in series with said first body of material and in series with said means connectable to a bias source, said non-linear loading member including a second body of material like that of said first body and a dielectric medium adjacent to said second body of a relative dielectric constant sufficient to cause said second body to present a current saturation at the electric fields above said first value.

2. The combination of claim 1 wherein the thickness of said dielectric medium is at least equal to or greater than the width of a domain.

3. The combination of claim 2 wherein the relative dielectric constant of said medium is greater than that of said second body.

4. The combination as claimed in claim 3 wherein the relative dielectric constant of said dielectric medium is at least 1.25 times that of the second body.

5. The combination as claimed in claim 4 wherein said material of said first and second body is such that the product of the length between said gating terminal and said second terminal times doping density is greater than $1 \times 10^{13}$ cm$^{-2}$ and the product of the thickness of the material of said first and second body times the doping density is greater than $1 \times 10^{12}$ cm$^{-2}$.

* * * * *